United States Patent [19]
Taniguchi et al.

[11] Patent Number: 5,000,692
[45] Date of Patent: Mar. 19, 1991

[54] I/O RELAY INTERFACE MODULE

[75] Inventors: Naohiro Taniguchi, Hirakata; Hiromi Nishimura, Takatsuki; Fumihiro Kasano, Shijonawate; Yutaka Sato, Tsu, all of Japan

[73] Assignee: Matsushita Electric Works, Ltd., Japan

[21] Appl. No.: 404,415

[22] Filed: Sep. 8, 1989

[30] Foreign Application Priority Data

Sep. 14, 1988 [JP] Japan .................. 63-230624
Jun. 27, 1989 [JP] Japan .................. 1-164382

[51] Int. Cl.⁵ .............................. H01R 9/24
[52] U.S. Cl. .................. 439/160; 361/386; 439/366; 439/487; 439/502; 439/716; 439/928
[58] Field of Search .......... 439/76, 709, 712–719, 439/487, 160, 502, 366, 928; 361/363, 353, 354, 356, 376, 379, 386, 393, 426

[56] References Cited

U.S. PATENT DOCUMENTS

| 4,658,375 | 4/1987 | Onogi et al. ............ 361/393 |
| 4,808,114 | 2/1989 | Mohri et al. ............ 439/76 |
| 4,878,860 | 11/1979 | Matsuoka ............ 439/716 |

FOREIGN PATENT DOCUMENTS 60-28088 7/1985 Japan .
63-88770 4/1988 Japan .
63-88771 4/1988 Japan .

Primary Examiner—Neil Abrams
Attorney, Agent, or Firm—Stevens, Davis, Miller & Mosher

[57] ABSTRACT

An I/O relay interface module for mounting a plurality of relays which are adapted to be connected to individual external I/O devices to be controlled or monitored by a central controller. The I/O module comprises a plurality of relay sockets for detachably receiving the relays, respectively, and a terminal section including wire terminals internally connected to the relays through the sockets for connection between the relays and the external devices. An I/O connector is provided on the I/O module for connection with the central controller to receive therefrom control signals for energizing the relays for control of the associated devices or transmit to the central controller monitor signals from the relays as indicative of the operation of the associated devices. Also included in the I/O module is an expansion I/O connector for connection with one or more additional I/O relays provided in association with additional I/O devices such that the additional I/O devices can be also controlled or be monitored by the center controller through the I/O relay interface module. Thus, the I/O interface module can be expanded to control or monitor one or more additional I/O devices through the respective relays.

6 Claims, 13 Drawing Sheets

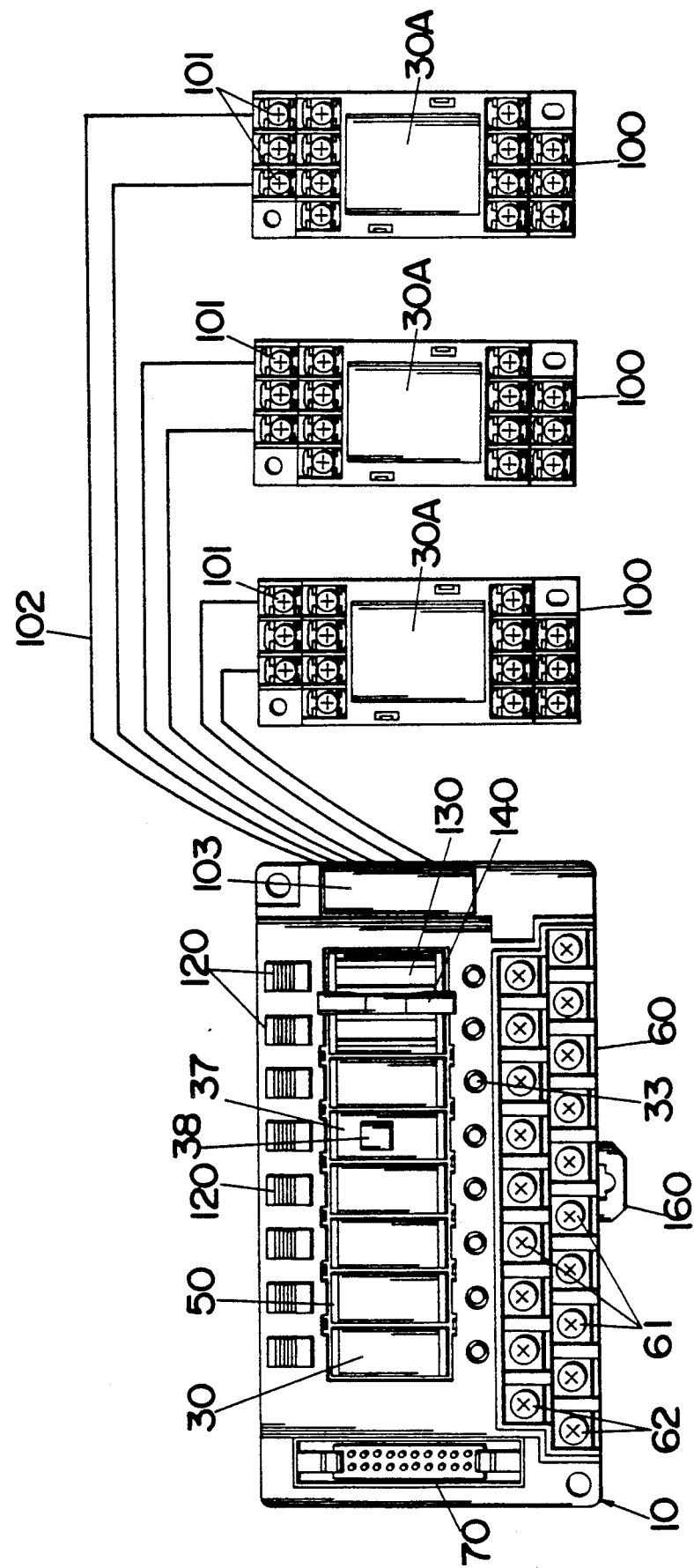

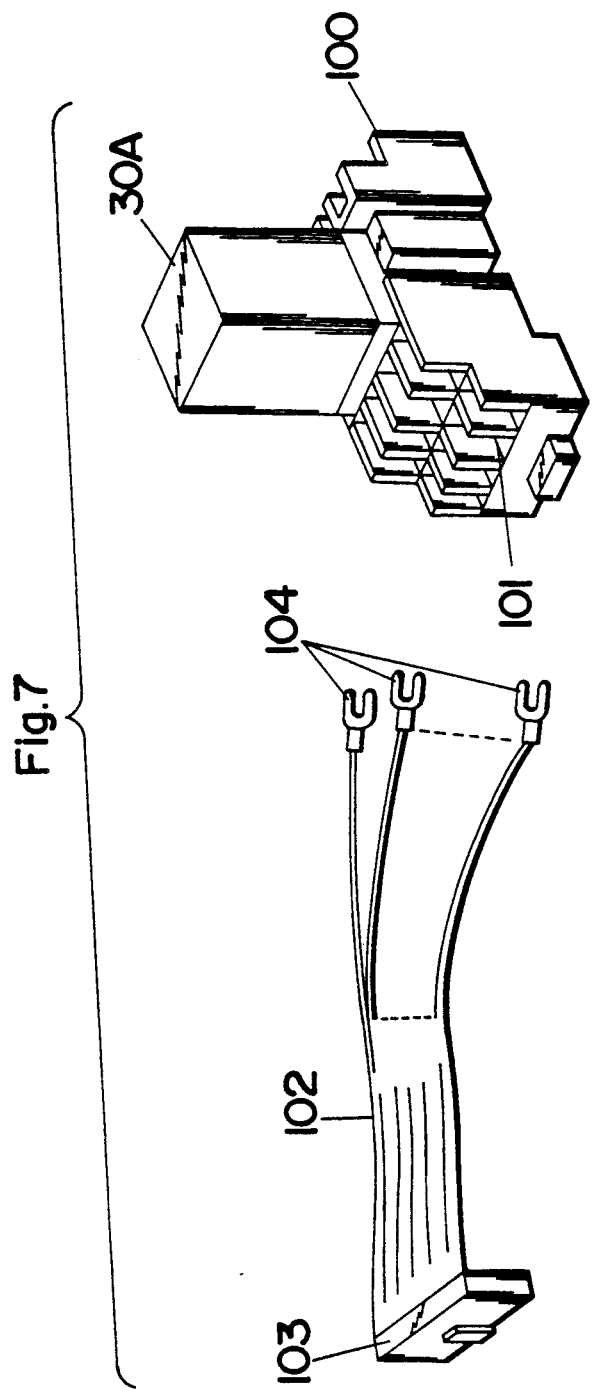

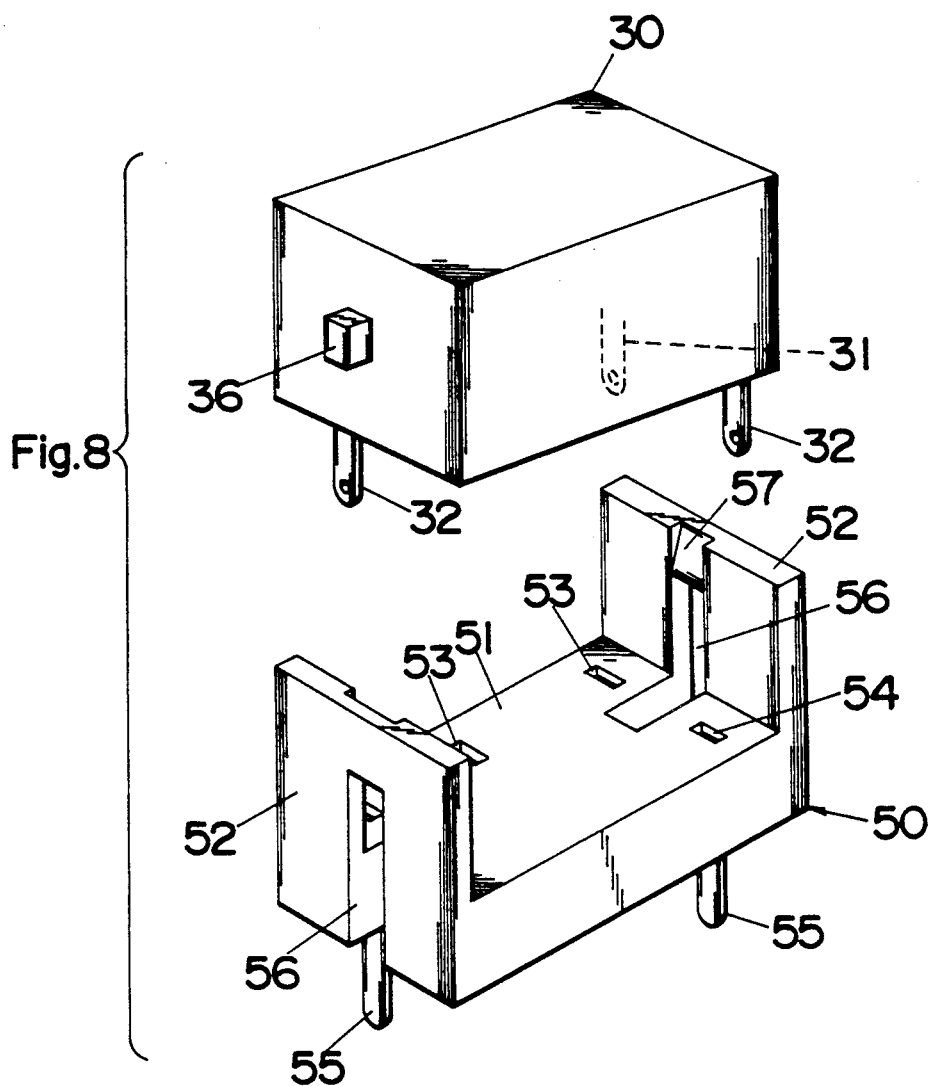
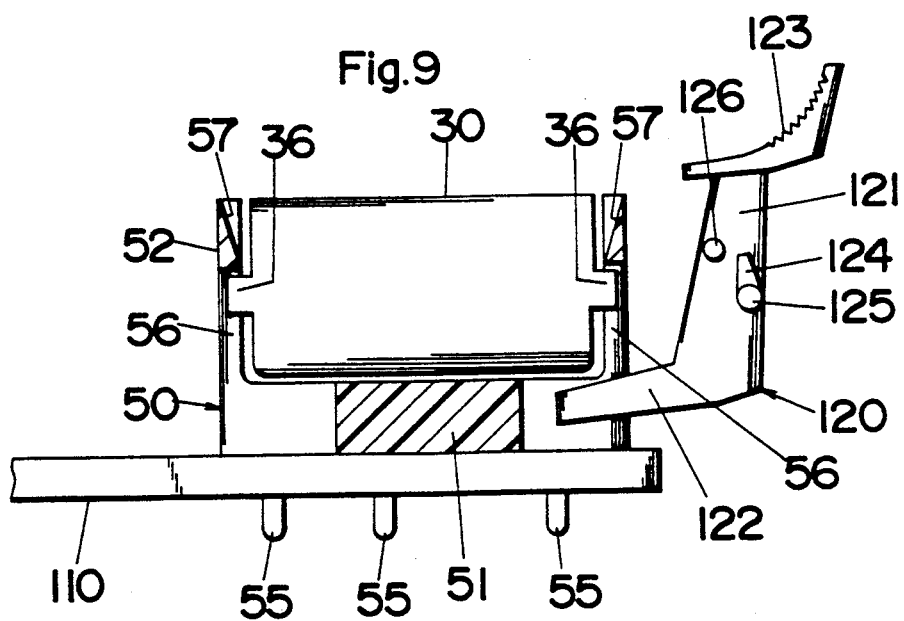

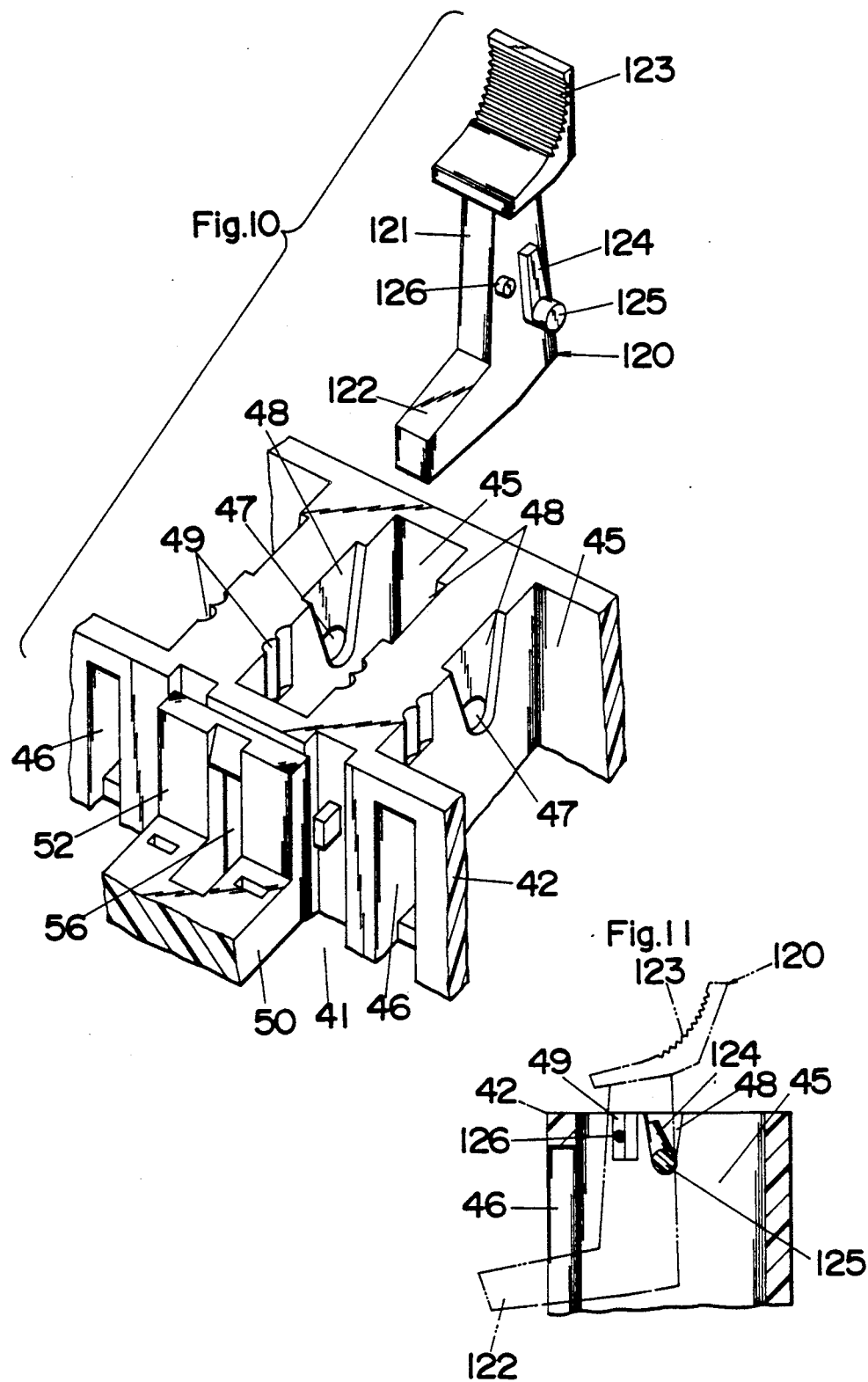

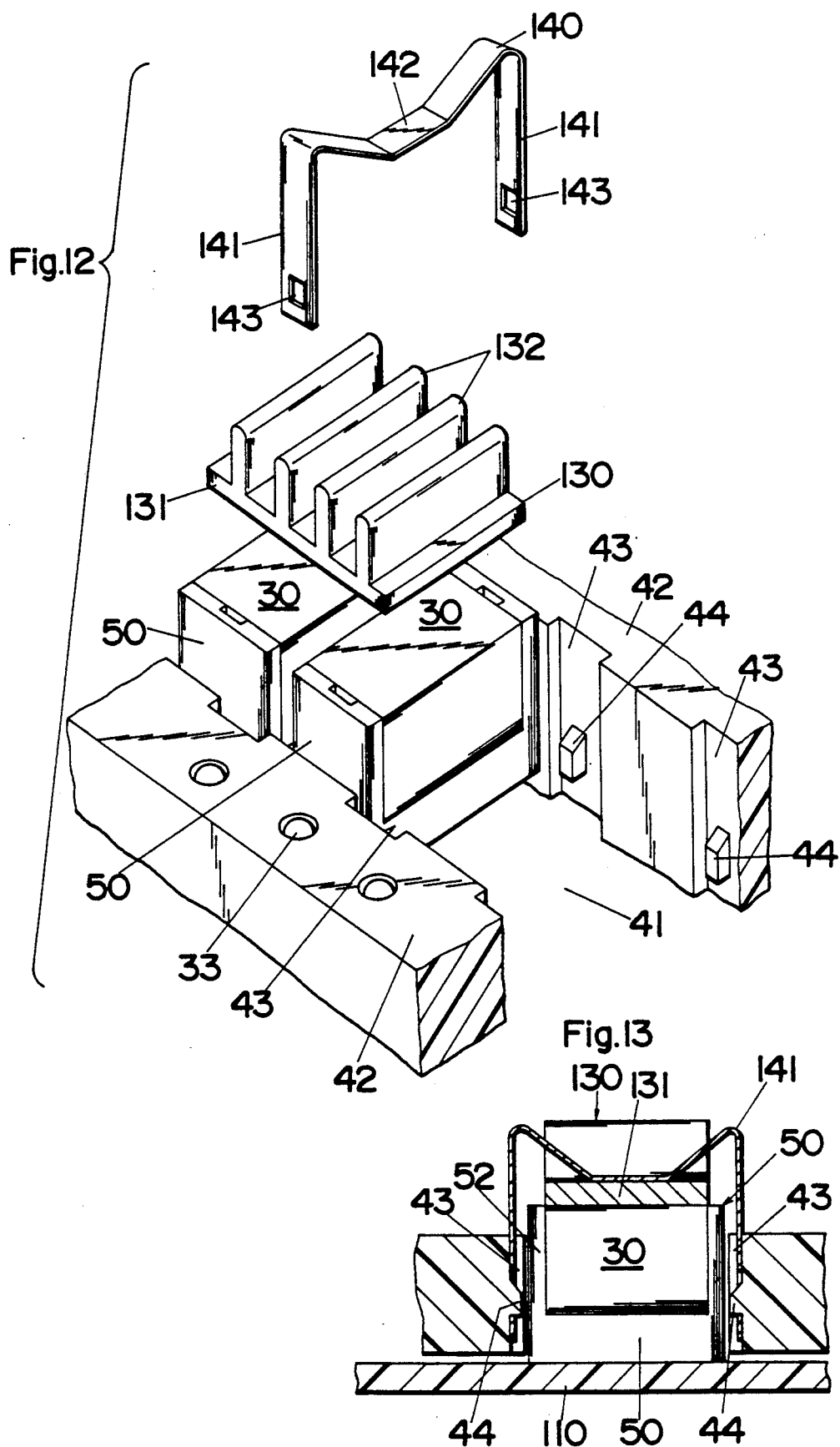

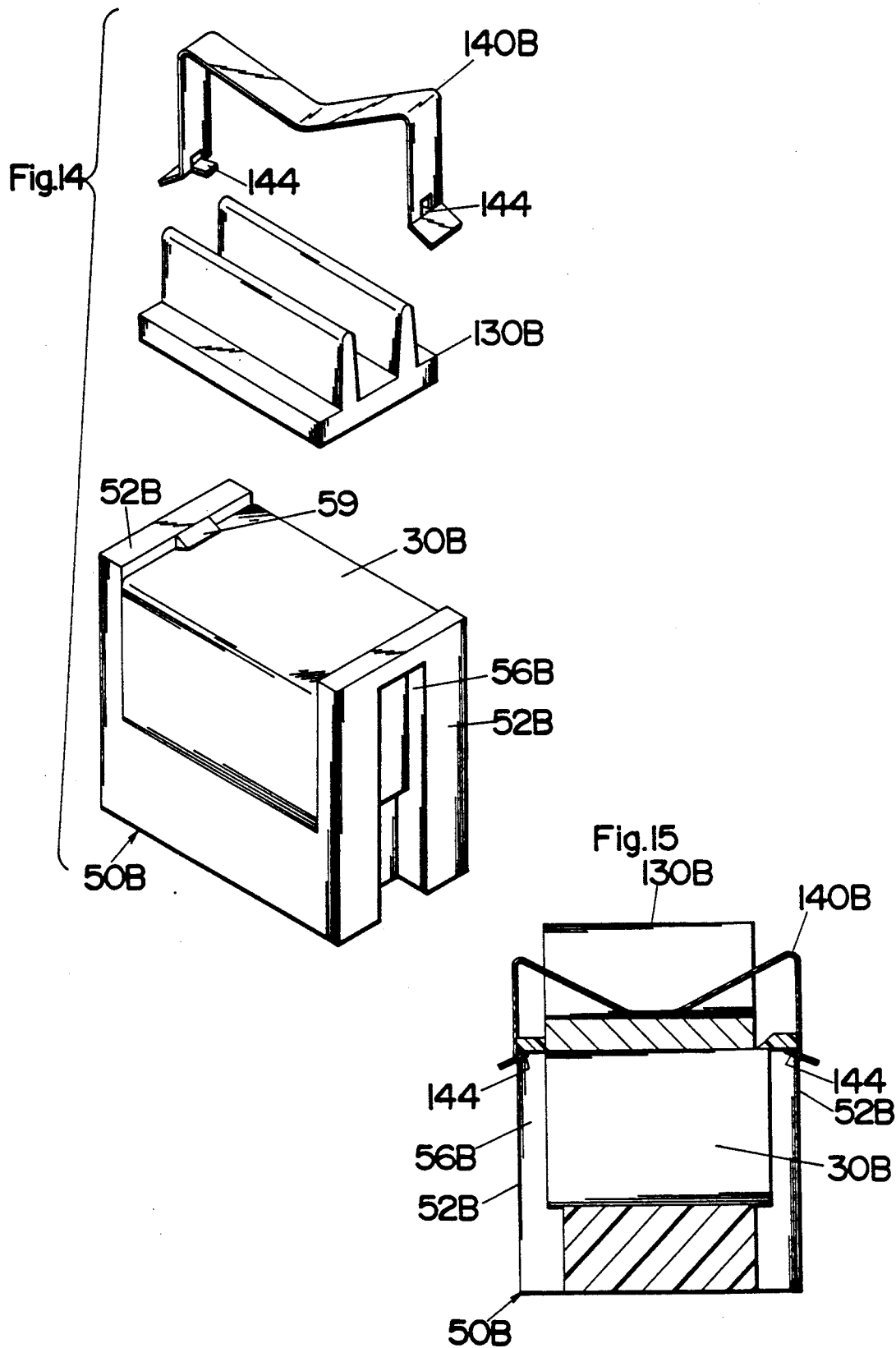

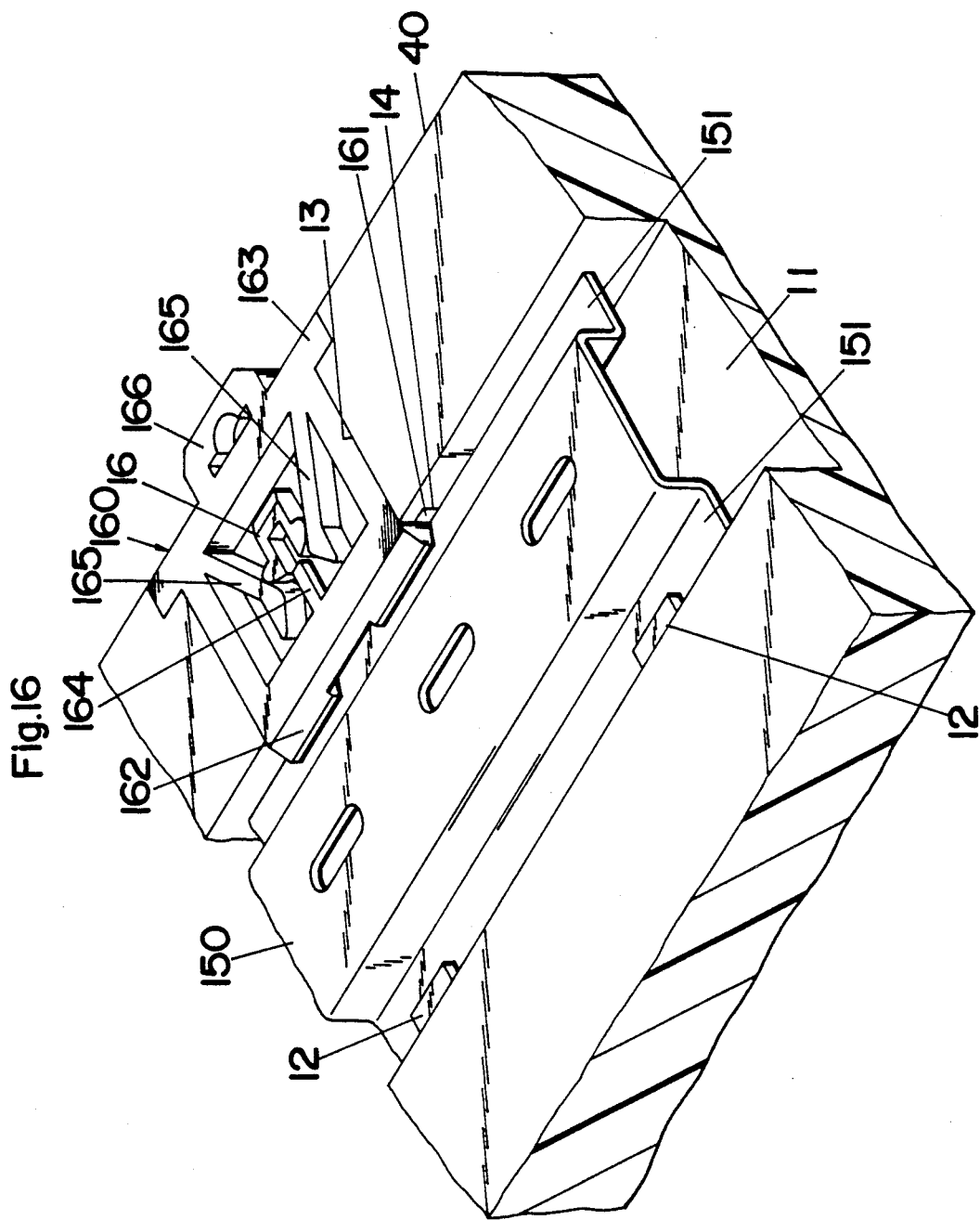

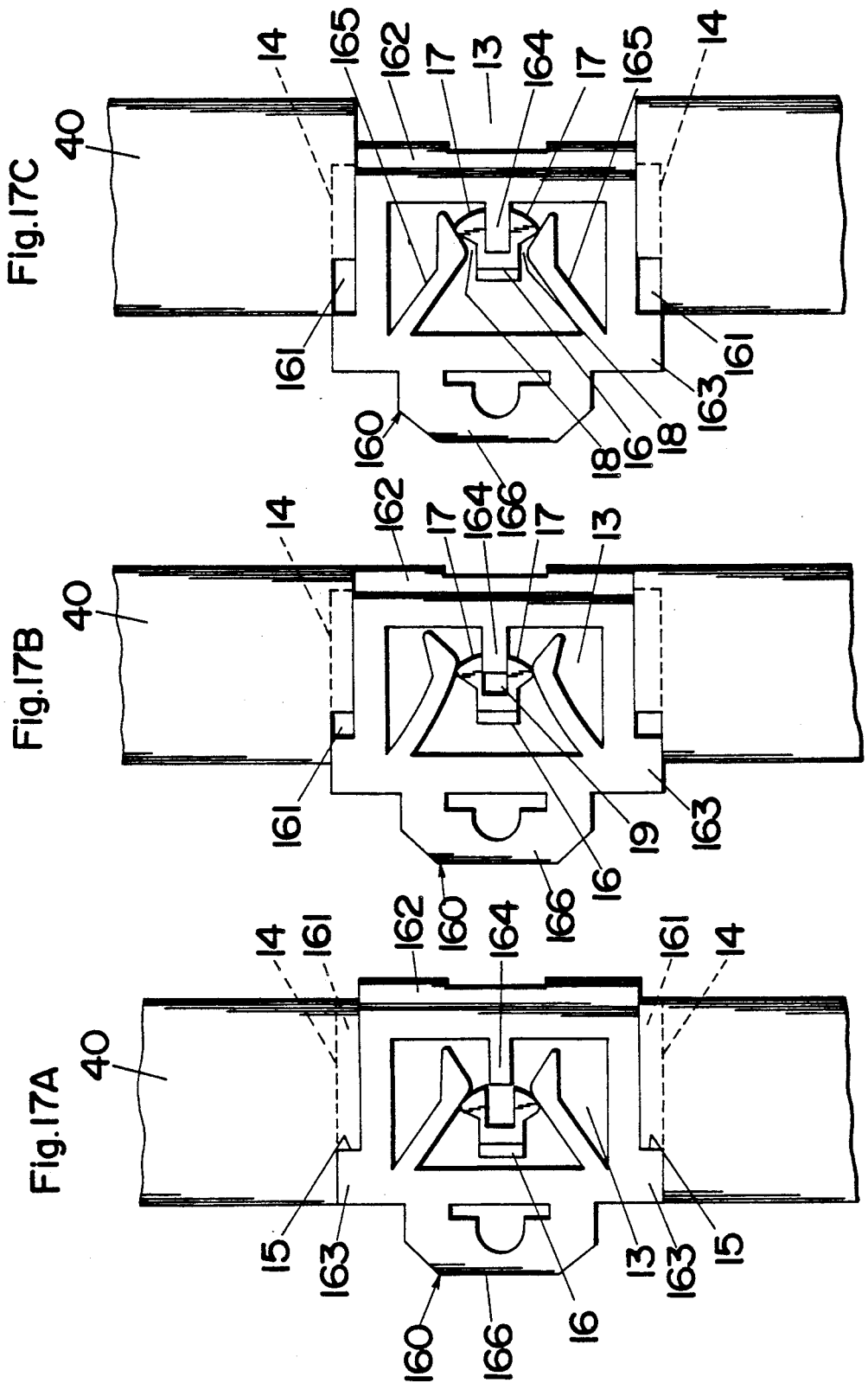

I/O RELAY INTERFACE MODULE

BACKGROUND OF THE INVENTION

1. Field of the Invention

The present invention is directed to an I/O relay interface module mounting a number of relays for coupling a central controller to a corresponding number of I/O devices through the respective relays.

2. Description of the Prior Art

In electrical systems controlling a number of external I/O devices by a central controller such as programmable controllers and single-board computers, there have been utilized relays for interface between the central controller and the individual I/O devices. In order to avoid complicated wiring between the central controller and the individual I/O devices through the respective relays and to avoid the attendant maintenance difficulty, it has been an industry practice to utilize an I/O relay interface module mounting the plural relays. The I/O relay interface module has a bus connector for communication with the central controller and a number of wiring terminals for connection with the individual external I/O devices. A time division multiplexing technique is utilized for the above communication between the central controller and the individual relays on the I/O relay interface module in order to control the I/O devices through the associated relays or to monitor the operations to the I/O devices through the associated relays. For such I/O relay interface module, there have been proposed prior art constructions as disclosed in Japanese Patent Publication (KOKAI) Nos. 63-88770 and 63-88771 (corresponding to U.S. Pat. No. 4,808,114 to Mohri et al). In the prior art patents, the I/O relay interface module is designed to only accept up to a fixed number of relays, for example, eight or sixteen relays on the module. With such constructions, the user have to utilize the interface module designed to have, for example, sixteen relays even when only a less number of, i.e., eight relays are required in an intended control system, which imposes undue cost to the system. On the other hand, it may be required after the initial completion of the system to add one or more relays with corresponding increase in the number of the I/O devices in the system. In such case, the user have to replace the existing I/O relay interface module with another module capable of mounting a more number of relays. This also results in undue increase in cost as well as incurs cumbersome operations of disconnecting and reconnecting the existing I/O device wiring.

SUMMARY OF THE INVENTION

The above problem has been eliminated in the present invention which discloses an improved I/O relay interface module. The I/O relay interface module of the present invention comprises a housing provided with a plurality of sockets for detachably receiving a corresponding number of relays which are adapted in use to be connected to individual external I/O devices to be controlled or monitored by a central controller through the interface module. The housing is provided with a terminal section which includes wire terminals for wiring connection of the relays to the corresponding I/O devices. The module incorporates a first set of interface circuits connected respectively to the relays on the module and a second set of interface circuits. An I/O connector is provided on the module for interconnection of the first set of interface circuits to the central controller so that the interface modules may receive control signals from the central controller to energize the individual relays for actuating the associated I/O devices or may transmit to the central controller monitor signals from the individual relays as indicative of the operations of the associated I/O devices. Also included in the interface module is an expansion I/O connector which is internally connected through the second set of interface circuits to the I/O connector. The expansion I/O connector is adapted to be connected through a suitable cable to one or more additional relays associated with the corresponding number of additional I/O devices such that the additional relays can be interconnected to the central controller through the second set of interface circuits, enabling it to control or monitor the operations of the additional I/O devices through the associated relays under the control of the central controller.

Accordingly, it is a primary object of the present invention to provide an improved I/O relay interface module which is capable of being expanded to be connected to one or more additional relays for actuation or monitoring of correspondingly additional I/O devices under the control of the same central controller.

In a preferred embodiment, the interface module include a plurality of release levers each disposed in an adjacent relation to each of the sockets. The release lever is pivotally supported at a portion intermediate its end to the housing with its one arm extending in an abuttable relation against the bottom of the relay and with the other arm extending above the top surface of the housing. Each of the sockets has a bottom wall with a slot through which the one arm of the corresponding release lever extend toward the bottom of the relay so that when the release lever is rotated about the pivot axis in one direction the one arm of the release lever will act on the bottom of the relay so as to lift it out of the socket. With the provision of the release levers, the relay can be removed from the socket simply by operating the release lever and without the need of directly holding the relay. Further with the above structure of the release lever, no parts or members are necessary on the top of the relay for removably holding the relay, thus contributing to reducing the height of the overall structure.

It is therefore another object of the present invention to provide an improved I/O relay interface module in which the relay can be easily removed simply by manipulating the release lever disposed adjacent the relay socket, yet maintaining the height dimension of the overall module at a minimum.

The sockets are received in side-by-side relation in a recess which is formed in the housing to have opposed side walls with vertical grooves. The vertical grooves are spaced along the length of the side walls and are each adapted to receive a leg portion of a U-shaped spring holder which extends over a radiator placed over the top of the relay or relays. A hook is formed in the bottom of each vertical groove for engagement with the corresponding leg portion of the spring holder to secure the radiator on the top of the relay or relays.

It is therefore a further object of the present invention to provide an improved I/O relay interface module which is designed to secure a radiator on the top of the relay by the use of a spring holder.

The interface module may be expanded to be connected to a plurality of relays which are mounted on an additional interface module or mounted separately on individual terminal blocks. When expanded to the additional interface module, the expansion connector of the interface module is to be connected to a like I/O connector of the additional interface module by a flat cable or the like cable having a number of wires fastened together. When expanded to individual relays each mounted on the terminal block, the expansion connector of the interface module is to be connected to each of the terminal blocks by the use of a special cable having a plug at one end and a set of wire leads at the other end. The plug is used to be connected to the expansion connector while the wire leads are fastened to the individual terminal blocks.

It is therefore a further object of the present invention to provide an improved I/O relay interface module which is capable of being expanded to include additional relays which may be mounted on a like interface module or mounted separately on individual terminal blocks.

In a modified form of the present invention, a radiator is secured on the top of the relay by a spring holder which is placed over the radiator and hooked to the socket. The socket has a pair of opposed end walls each formed in its exterior surface with a notch for engagement with the end portion of the spring holder.

It is therefore a further object of the present invention to provide an improved I/O relay interface module in which a spring holder is hooked to the socket of the relay to secure the radiator on the top of the relay.

The housing of the interface module is formed with a channel extending along one dimension thereof for detachable connection to a mount rail having outwardly extending opposed flanges. A slider is included in the housing to be slidable in a direction transverse with the channel between an unlock position and a lock position and is spring biased into the lock position. In the unlock position, the slider has its forward edge retracted from the channel to allow one of the flanges of the mount rail to move into the channel. In the lock position, the slider has its forward edge extending inwardly into the channel for engagement with one of the flanges of the mount rail so as to mount the interface module housing on the mount rail. The slider is further movable outwardly past the unlock position into a release position in which the forward edge of the slider is away from the channel and is free from the spring bias such that the slider is retained at this position. Thus, when installing the interface module on the mount rail, the slider moves from the lock position to the unlock position against the spring bias, thereby allowing the flange of the mount rail to pass into the channel, after which the slider returns by the spring bias into the lock position for engagement with the flange. When removing the interface module from the mount rail, the slider can be moved into the release position where it receives no spring bias and is kept in this position so that the user is not required to keep holding or pulling the slider against the spring bias, thus facilitating the removal of the interface module housing from the mount rail.

It is therefore a further object of the present invention to provide an improved I/O relay interface module which can be easily mounted and demounted to and from a mount rail.

These and still other objects and advantages will become more apparent from the following description of the embodiment of the present invention when taken in conjunction with the attached drawings.

BRIEF DESCRIPTION OF THE DRAWINGS

FIG. 6 is a top view of the interface module as connected to individual terminal blocks each mounting a single relay;

FIG. 7 is a perspective view of the terminal block shown with a connector cable utilized therewith;

FIG. 8 is a perspective view of a socket incorporated in the interface module and the relay to be received therein;

FIG. 9 is a partially sectional view showing the socket and a release lever for removable of the relay;

FIG. 10 is an exploded perspective view of the release lever and the associated portion of an interface module housing;

FIG. 11 is a schematic view illustrating a limited angular movement given to the release lever;

FIG. 12 is an exploded perspective view illustrating a structure for securing a radiator on the top of the relays by the use of a spring holder;

FIG. 13 is a sectional view of the radiator secured to the top of the relay;

FIG. 14 is an exploded perspective view illustrating a structure for securing a radiator on the top of the relay by a spring holder in accordance with a modification of the above embodiment;

FIG. 15 is a sectional view of the radiator secured to the top of the relay according to the modification of FIG. 14;

FIG. 16 is a perspective view illustrating a bottom portion of the interface module housing with a slider engageable with the mount rail;

FIGS. 17A, 17B, and 17C are respectively views illustrating the slider in its lock, unlock, and release positions.

DETAILED DESCRIPTION OF THE EMBODIMENT

Figure 1:
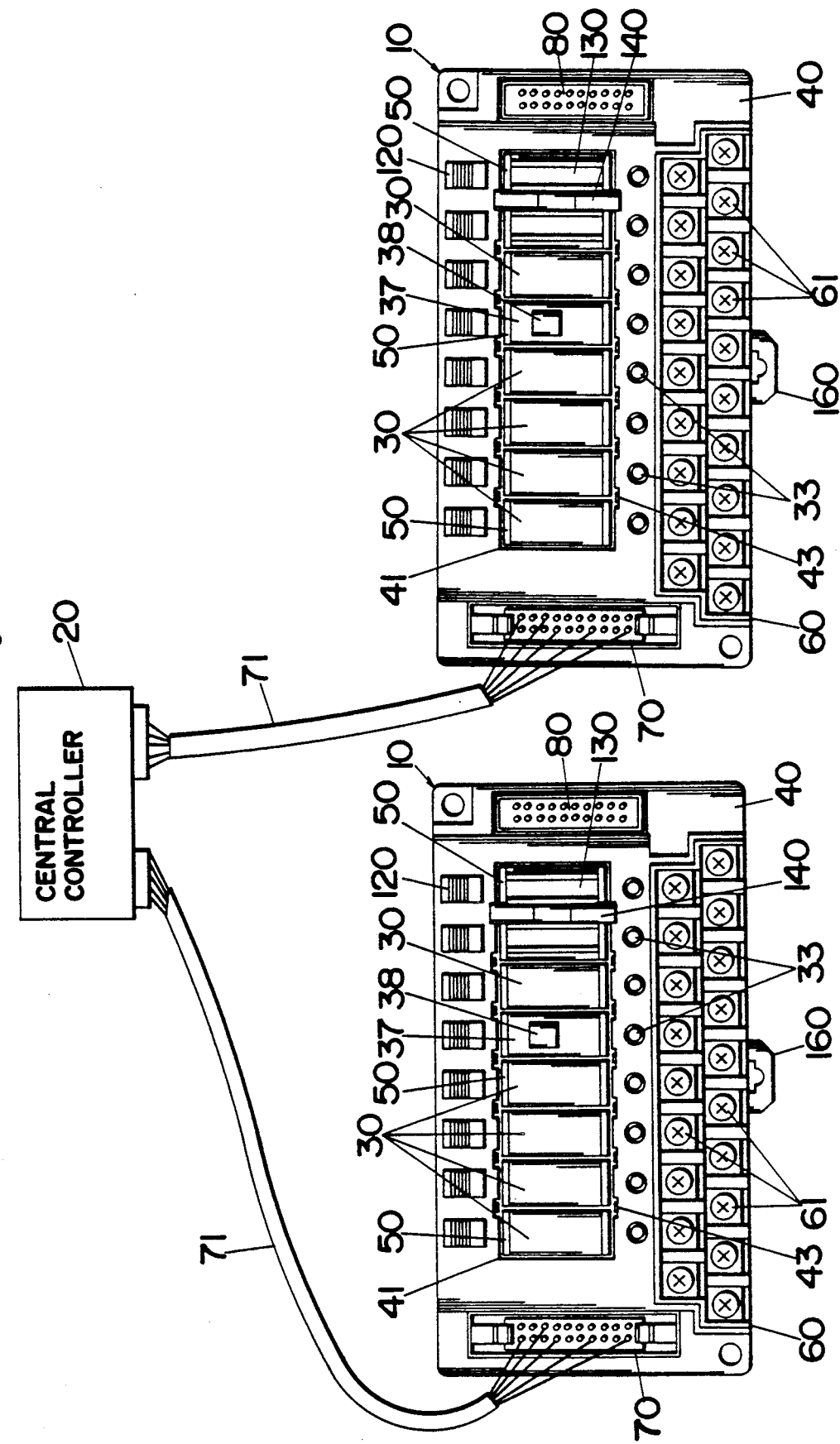
FIG. 1 is a top view of an I/O relay interface module in accordance with a preferred embodiment of the present invention.
Figure 2:
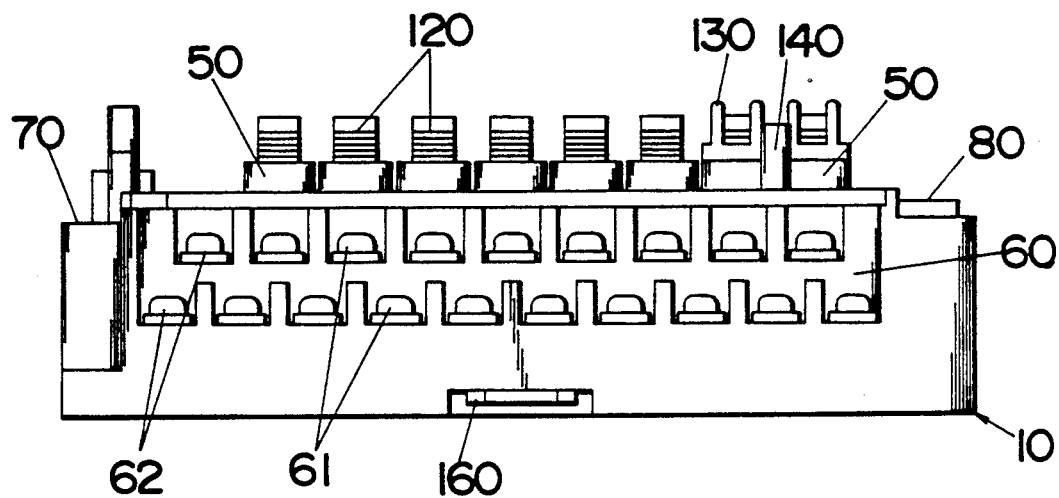
FIG. 2 is a side view of the interface module.
Figure 3:
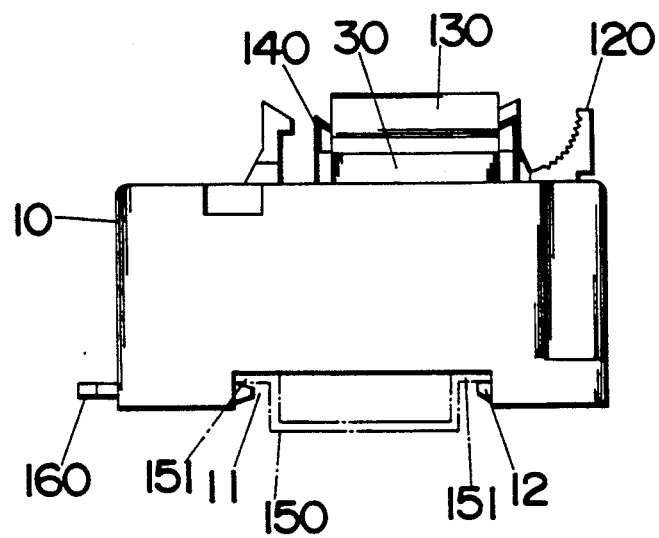
FIG. 3 is an end view of the interface module with a mount rail shown in dotted lines.

Referring now to FIG. 1, there is shown a pair of I/O relay interface modules in accordance with a preferred embodiment of the present invention. The I/O relay interface module 10 interfaces a central controller 20 to a number of I/O devices (not shown) through a corresponding number of relays 30 mounted on the interface module 10. The interface module 10 therefore may be utilized to operate the I/O devices through the corresponding relays 30 or may be utilized to monitor the operations of the individual I/O devices through the corresponding relays 30 under the control of the central controller 20 such as a programmable controller. Thus, two types of I/O relay interface modules can be utilized in a control system, as shown in FIG. 1 in which the interface module 10 at the left hand may be utilized as an output interface module 10 for control of the I/O devices and the interface module 10 at the right hand as an input interface module for monitoring the operations of the I/O devices.

The interface module 10 comprises a rectangular housing 40 with an elongated center recess 41 which accommodates a number of sockets 50 each detachably receiving each of the relay 30. A terminal section 60 is formed along one side of the housing 40 and includes a number of wire terminals 61 for wiring connection with the individual I/O devices to be controlled or monitored. Formed at one end of the housing 40 is an I/O connector or port 70 for connection with the central controller 20 by means of a flat or ribbon cable 71. An expansion slot or connector so is formed at the opposite end of the housing 40 for connection by means of an expansion cable (not shown) with an expansion relay interface module 90 (as schematically shown in FIGS. 4 and 5) mounting a plurality of additional relays 30, or alternately for connection by means of another expansion cable 102 with individual terminal blocks 100 each mounting a single relay 30A, as shown in FIGS. 6 and 7.

As shown in FIGS. 8 and 9, the socket 50 is in the form of a U-shaped configuration having a base 51 with a pair of upright end walls 52 extending from the opposite ends of the base 51. The relay 30, which may be an electromagnetic relay or solid-state relay having input and output leads 31 and 32, is received between the end walls 52 with the leads 31 and 32 extending into corresponding holes 53 and 54 in the base 51 for electrical connection with corresponding pins 55 extending downward from the bottom of the socket 50. The sockets 50 are mounted on a printed board 110 with the pins 55 connected to conductor lines leading to the I/O port 70 and also to the suitable wire terminals 61. The printed board 110 forms thereon a first set of interface circuits or conductor paths 111 for electrical connection of the input or output ends of the individual relays 30 with the I/O port 70.

Figure 4:
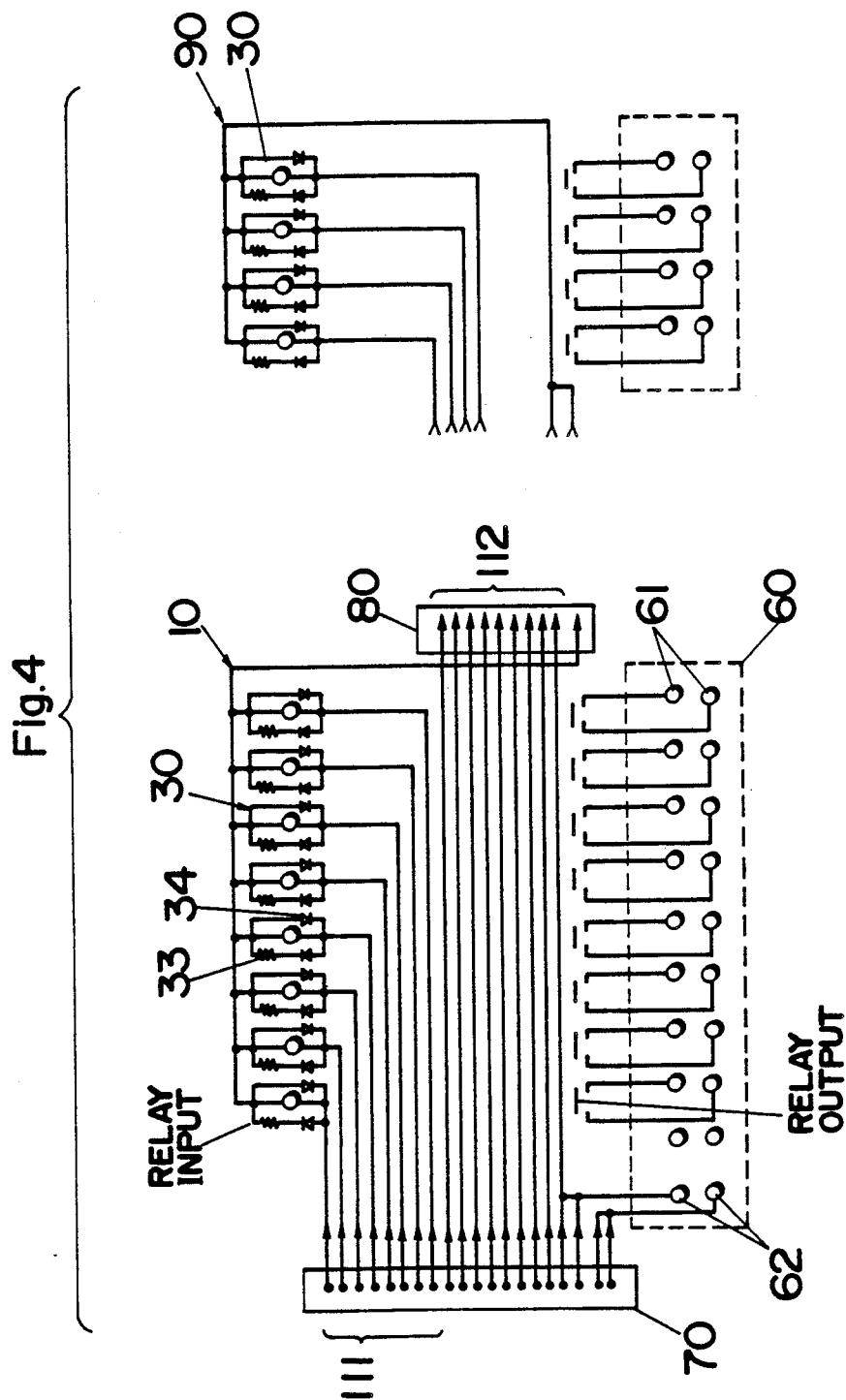
FIG. 4 is a diagram showing an internal connection of the interface module to an expansion interface module when relays on the interface modules are utilized to control individual I/O devices wired to the modules.
Figure 5:
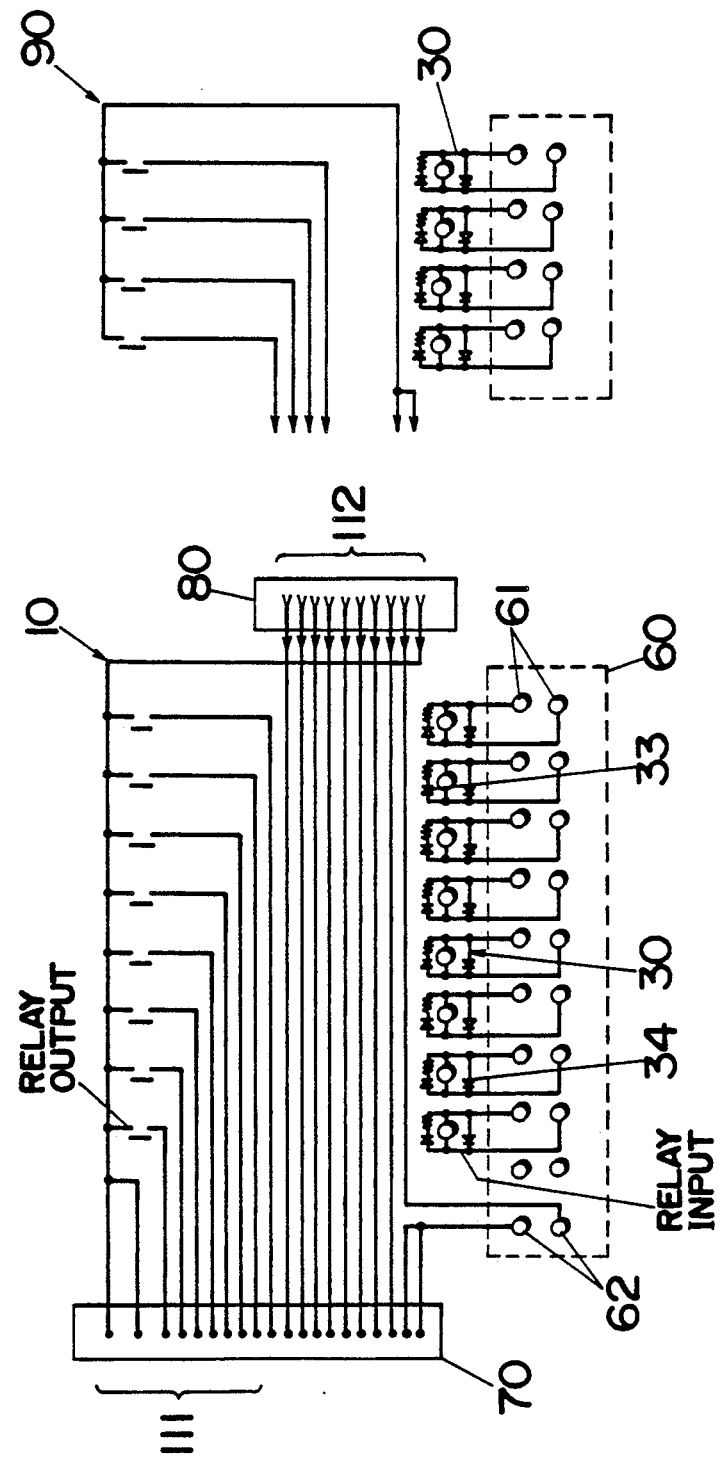
FIG. 5 is a diagram showing an internal connection of the interface module to an expansion interface module when relays on the interface modules are utilized to monitor the operations of individual I/O devices wired to the modules.
Figure 18:
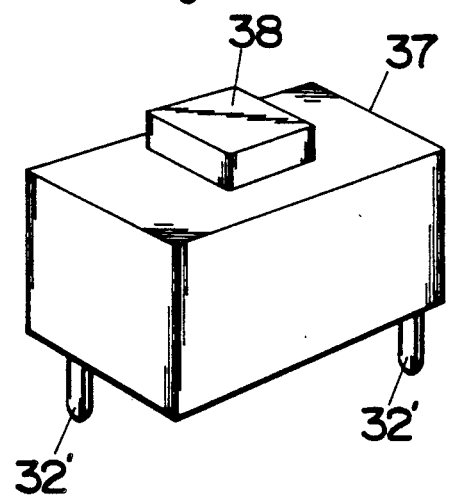
FIG. 18 is a perspective view of a dummy relay which may be mounted on the interface module.

In the illustrated embodiment of FIGS. 4 and 5, the first set includes eight (8) interface circuits 111 which correspond in number to the number of the relays 30 mounted on the interface module 10. Also formed on the printed board 110 is a second set of auxiliary interface circuits or paths 112 which form an internal bus interconnecting the I/O port 70 and the expansion slot so. In the illustrated embodiment eight (8) auxiliary circuits 112 are provided so that the module 10 can be expanded to accept up to a total of sixteen (16) relays. When the interface module 10 is utilized as the output interface as shown in FIG. 4, the input ends of the relays 30 are coupled to the corresponding interface circuits 111 in the first set so that the relays 30 can be energized by control signals transmitted through the I/O port 70 from the central controller 20. In this instance, the output ends of the relays 30 are coupled to the corresponding wire terminals 61 for actuating the corresponding I/O devices wired thereto. When, on the other hand, the interface module 10 is utilized as the input interface as shown in FIG. 5, the output ends of the relays 30 are connected the interface circuits 111 in the first set for transmitting back to the central controller 20 therethrough monitor signals indicative of the operations of the corresponding I/O devices. In this instance, therefore, the relays 30 have their input ends connected to the corresponding wire terminals 61 so that the relays 30 can be energized and deenergized in response to the varying operating conditions of the corresponding I/O devices wired to the terminals 61, thus producing the monitor signals to be transmitted back to the central controller 20. In both cases, a light emitting diode (LED) 33 is connected across the input ends of each relay 30 so that it produces a light for confirmation of the energization of the relay 30. As seen in FIG. 1, the LEDs 33 are disposed along the row of the relays 30 corresponding one by one to the associated relays 30 for easy confirmation. A surge absorbing diode 34 is also connected across the input ends of each relay 30. The terminal section 60 include power terminals 62 which receives line voltage from the central controller 20 and which are connected internally to the bus leading to the expansion slot 80. Although the above embodiment illustrates that the interface module 10 accepts up to eight relays 30 and can be expanded to accept up to eight more additional relays, the present invention should not be limited to that particular numbers and may be suitably arranged to accept different number of relays as necessary. In FIG. 1, the interface module 10 is shown to have a dummy relay 37 with a push button 38 for the purpose of checking the system operation. The dummy relay 37 includes a contact which opens and closes by the manipulation of the push button 38 to provide a signal simulating the output of the relay 30. The simulating signal is fed through terminal leads 32' (as shown in FIG. 18) of the dummy relay 37 and through the corresponding socket terminals to the circuits including to the I/O devices.

As shown in FIGS. 6 and 7, when the interface module 10 is expanded to include the relays 30A separately mounted on the individual terminal blocks 100, as in the case where the additional relays are of high current requirement and therefore of large dimensions, a cable 102 is utilized which has a connector 103 at one end and separate wire leads 104. The connector 103 is plugged into the expansion slot 80 of the interface module 10 and the individual wire leads 104 are wired to terminals 101 of the corresponding terminal blocks 100 for connection of the internal bus of the interface module 10 to the additional relays 30A on the individual terminal blocks 100.

Returning back to FIGS. 8 and 9, the socket 50 is formed with a pair of slots 56 each extending from the end portion of the base 51 to the adjacent end wall 52 and terminating at an inclined edge 57 at the upper end of the end wall 52. The relay 30 has a pair of latches 36 projecting respectively on the opposite end faces for engagement with the slots 56 of the socket 50. The end walls 52 have resiliency so that when the relay 30 is pushed down into the socket 50, the latch 36 will ride up on the inclined edge 57 as flexing the end walls 52 outwardly, after which the end walls 52 return inwardly to engage the latches 36 with the upper ends of the slots 56. Removal of the relays 30 from the sockets 50 is made by release levers 120 provided in number corresponding to the number of sockets 50 and arranged in a row parallel to the rows of the relays 30, as shown in FIG. 1. The release lever 120 is of a generally L-shaped configuration with upper and lower arms 121 and 122 and is received in a corresponding opening 45 which is separated from the recess 41 for the sockets 50 by a dividing wall 42 which defines one of the side walls of the recess 41 and is formed with spaced windows 46 each corresponding to each one of the openings 45, as shown in FIG. 10. The release lever 120 has on its side faces a pair of stop projections 124 and pivot pins 125 each extending horizontally from the lower end of the projection 124. The pivot pins 125 are inserted in corresponding bearing holes 47 in the side walls of the opening 45 to pivotally support the release lever 120 with the upper arm 121 projecting above the top surface of the housing 40 and with the lower arm 122 extending through the window 46 and through slot 56 in the socket 50 for abutment with the bottom of the relay 30 in the socket 50. The release lever 120 has at its upper end an operator knob 123 by the manipulation of which the release lever 120 pivots about the pins 125. When the release lever 120 is turned to the right in FIG. 9, the lower arm 122 acts on the bottom of the relay 30 to force it up from the socket 50. At this occurrence, the end walls 52 of the socket 50 is resiliently deformed outwardly to permit the escape of the latches 36 from the slots 56, thus effecting the removal of the relay 30 from the socket 50. The stop projections 124 are received respectively in notches 4 corresponding formed in the side walls of the opening 45. The notch 48 is of a generally triangular configuration within the bottom angle of which the stop projection 124 is allowed to move for effecting a limited angular movement of the release lever 120 between an unactuated position of keeping the relay 30 in the socket 50 and a release position of lifting it up from the socket 50. Also formed on the release lever 120 are click pins 126 which engage in stepped grooves 49 formed respectively in the side walls of the opening 45 so as to give a clicking movement to the release lever 120 between the unactuated and the release positions.

FIGS. 12 and 13 illustrates a structure of adding a radiator 130 on the two adjacent relays 30 mounted in the module 10. The radiator 130 comprises a base 131 and a plurality of parallel fins 132 projecting from the base 131 and is placed over the top surfaces of the adjacent relays 30. A generally U-shaped spring holder 140, which is utilized to clamp the radiator 130 on the relays 30, comprises a pair of legs 141 connected by a web 142. The spring holder 140 is placed over the radiator 130 on the relays 30 with the web 142 extending between the adjacent fins 132 and with the legs 141 inserted respectively into corresponding vertical grooves 43 formed in the side walls 42 of the recess 41. The vertical grooves 43 are equally spaced along the length of the side wall 42 to be each located at a position corresponding to the junction of the adjacent relays 30. Within each vertical groove 43 there is formed a hook 44 which engages in an eye 143 formed in the lower end of each leg 141 for fixing the spring holder 140 in position, thereby securing the radiator 130 on the top of the adjacent two relays 30.

FIG. 14 illustrates another structure of adding a radiator 130B on the top of a single relay 30B in accordance with a modification of the above embodiment. In this modification, a spring holder 140B is supported on a socket 50B rather than fixed to the module housing 40. The relay 30B is received between end walls 52B of the socket 50B and is latched in this position by a latch projection 59 which projects inwardly from the upper end of one side wall 52A to engage with the upper end of the relay 30A. The spring holder 140B is formed at its lower ends respectively with inwardly bent tabs 144 which engages with the upper ends of slots 56B to hold the radiator 130B on top of the relay 30B.

As shown in FIG. 16, the bottom of the housing 40 has a channel 11 extending the full length of the housing 40 for receiving therein a mount rail 150 with outwardly extending flanges 151. The interface module 10 is detachably installed on the mount rail 150 by engaging one of the flanges 151 with projections 12 on one side wall the channel 11 and by engaging the other flange 151 with a slider 160 fitted in the bottom of the housing 40. The slider 160 is received in a transverse trough 13 in the bottom of the housing 40 to be slidable therealong. Formed on both sides of the slider 160 are flaps 161 which are inserted into respective grooves 14 extending along the sides of the trough 13 adjacent the bottom thereof so as to retain the slider 160 in the bottom of the module housing 40. The slider 160 is slidable between an innermost position of FIG. 17A and an outermost position of FIG. 17C past an intermediate position of FIG. 17B. The innermost position of FIG. 17A is a lock position in which a forward inclined edge 162 of the slider 160 extends into the channel 11 to catch the other flange 151 therebehind, and in which stop shoulders 163 at the rear end of the slider 160 abut against notches 15 at the outer end of the trough 13 for preventing further inward movement of slider 160. The intermediate position of FIG. 17B is an unlock position in which the forward edge 162 is substantially aligned with the edge of the channel 11 to permit the other flange 151 to freely move in and out of the channel 11. The outermost position of FIG. 17C is a release position in which the forward edge 162 retracts inwardly away from the edge of the channel 11, and in which a center prop 164 of the slider 160 is stopped by a catch 16 on the bottom of the trough 13 so as to prevent further outward movement of the slider 160. The slider 160 comprises a rectangular frame of plastic material within which the center prop 164 extend integrally from the front of the slider 160. Also within the frame there is integrally formed a pair of resilient legs 165 which extend from the rear corners of the frame inwardly toward the catch 16 for pressed contact respectively with cam surfaces 17 on both sides of the catch 16. The cam surfaces 17 are formed on the front end of the catch 16 and define therebehind dents 18, respectively. A mouth 19 is formed in the front end of the catch 16 to receive therein the center prop 164 when the slider 160 is between the positions of FIGS. 17B and 17C.

During the slider movement between the lock position of FIG. 17A and the unlock position of FIG. 17B, the resilient legs 165 have their free ends in pressed slidable contact with the cam surfaces 17 and are caused to flex outwardly as the slider 160 moves from the lock position of FIG. 17A to the unlock position of FIG. 17B, and flex outwardly at a maximum extent when the slider 160 comes to the unlock position of FIG. 17A. The outward flexing of the resilient legs 65 produces a spring bias urging the slider 160 towards the lock position of FIG. 17A. Thus, when mounting the module housing 40 on the mount rail 150, the other flange 151 of the mount rail 150 abuts against the inclined forward edge 162 of the slider 160 in the lock position of FIG. 17A and then forces the slider 160 to move inwardly against the spring bias toward to the unlock position of FIG. 17B, thereby permitted to enter into the channel 11 past the slider 160. At this moment, the slider 160 returns by its resiliency to the lock position to latch the other flange 151 of the mount rail 150 behind the forward edge 162 of the slider 160 to hold the module housing 40 on the mount rail 150. When the slider 160 is moved from the unlock position of FIG. 17B to the release position of FIG. 17C, the free ends of the resilient legs 165 ride up the rear ends of the cam surfaces 17 and to fall into the corresponding dents 18 in which the resilient legs 165 receives no flexing deformation and therefore produce no spring bias to the slider 160, thereby retaining the slider 160 at this release position. For pulling the slider 160 into the release position, the slider 160 is formed at its rear end with a pull tab 166. In this release position, the flange 151 of the mount rail 150 is free to move out of the channel 11, eliminating the necessity to keep pulling the slider 160 against the spring bias when removing the interface module 10 from the mount rail 150 and therefore facilitating the removal of the interface module 10. The slider 160 can be returned back to the lock position by simply pushing the slider 160 inwardly, in which the inward force applied to the slider 160 causes the resilient legs 165 to flex outwardly, allowing the free ends of the resilient legs 165 to move out of the dents 18 and come again into pressed contact with respective the cam surfaces 17, thus returning the slider 160 to the lock position of FIG. 17A.

What is claimed is:

1. An I/O relay interface module for mounting a plurality of relays which are adapted to be connected between a central controller and individual external I/O devices, said interface module comprising:
   a housing;
   a plurality of relay sockets provided in said housing for detachably receiving respective ones of said relays;
   a terminal section on said housing, said terminal section including wire terminals internally connected to said relays through said sockets and adapted for wiring connection of said relays to correspondence ones of said external I/O devices;
   an I/O connector provided on said housing for connection of said relays to said central controller such that the individual relays can receive or transmit from and to said central controller signals actuating the associated I/O devices or indicating the operations of the individual I/O devices; and
   an expansion I/O connector provided on said housing for connection with one or more additional relays to be connected to additional I/O devices, said expansion I/O connector internally connected to said I/O connector such that said additional relays are interconnected to said central controller and can receive or transmit from and to said central controller signals actuating the additional I/O devices or indicating the operations of said additional I/O devices wherein each of said sockets has a bottom wall with a slot, said housing including a plurality of release levers disposed adjacent respectively to said sockets, said release lever being held pivotable about a pivot axis intermediate the ends thereof with one arm of said release lever extending through said slot in the bottom wall of said socket into an abuttable relation against a bottom of said relay and with the other arm projecting on a top surface of said housing such that when the release lever is rotated about said pivot axis in one direction said one arm of the release lever will act on the bottom of said relay for lifting it out of said socket.

2. An I/O relay interface module for mounting a plurality of relays which are adapted to be connected between a central controller and individual external I/O devices, said interface module comprising:
   a housing;
   a plurality of relay sockets provided in said housing for detachably receiving respective ones of said relays;
   a terminal section on said housing, said terminal section including wire terminals internally connected to said relays through said sockets and adapted for wiring connection of said relays to corresponding ones of said external I/O devices;
   an I/O connector provided on said housing for connection of said relays to said central controller such that the individual relays can receive or transmit from and to said central controller signals actuating the associated I/O devices or indicating the operations of the individual I/O devices; and
   an expansion I/O connector provided on said housing for connection with one or more additional relays to be connected to additional I/O devices, said expansion I/O connector internally connected to said I/O connector such that said additional relays are interconnected to said central controller and can receive or transmit from and to said central controller signals actuating the additional I/O devices or indicating the operations of said additional I/O devices wherein said housing is formed with a recess in which said sockets are received in side-by-side relation, said recess having opposed side walls with vertical grooves which are spaced along the length of said side wall and are formed with hooks, said vertical grooves adapted to receive end portions of a spring holder which extends over a radiator to be placed over the top of said relay, said hooks adapted to be engaged in corresponding holes in said end portions of said spring holder to secure said radiator on said relay.

3. An I/O relay interface module for mounting a plurality of relays which are adapted to be connected between a central controller and individual external I/O devices, said interface module comprising:
   a housing;
   a plurality of relay sockets provided in said housing for detachably receiving respective ones of said relays;
   a terminal section on said housing, said terminal section including wire terminals internally connected to said relays through said sockets and adapted for wiring connection of said relays to corresponding ones of said external I/O devices;
   an I/O connector provide don said housing for connection of said relays to said central controller such that the individual relays can receive or transmit from and to said central controller signals actuating the associated I/O devices or indicating the operations of the individual I/O devices; and
   an expansion I/O connector provided on said housing for connection with one or more additional relays to be connected to additional I/O devices, said expansion I/O connector internally connected to said I/O connector such that said additional relays are interconnected to said central controller and can receive or transmit from and to said central controller signals actuating the additional I/O devices or indicating the operations of said additional I/O devices wherein said socket has a pair of opposed end walls between which the corresponding relay is received, said side walls having in their outer surface respective notches adapted for engagement with end portions of a spring holder, said spring holder extending over a radiator placed on the relay so as to secure said radiator on the top of said relay.

4. An I/O relay interface module for mounting a plurality of relays which are adapted to be connected between a central controller and individual external I/O devices, said interface module comprising:
- a housing;
- a plurality of relay sockets provided in said housing for detachably receiving respective ones of said relays;
- a terminal section on said housing, said terminal section including wire terminals internally connected to said relays through said sockets and adapted for wiring connection of said relays to corresponding one s of said external I/O devices;
- an I/O connector provided on said housing for connection of said relays to said central controller such that the individual relays can receive or transmit from and to said central controller signals actuating the associated I/O devices or indicating the operations of the individual I/O devices; and
- an expansion I/O connector provided on said housing for connection with one or more additional relays to be connected to additional I/O devices, said expansion I/O connector internally connected to said I/O connector such that said additional relays are interconnected to said central controller and can receive or transmit from and to said central controller signals actuating the additional I/O devices or indicating the operations of said additional I/O devices wherein said housing has a channel extending along one dimension thereof for detachable connection to a mount rail having outwardly extending opposed flanges, said housing including a slider slidable in a direction transverse to said channel between a lock position in which said slider has its forward edge extending inwardly into said channel for engagement with one of said flanges and an unlock position in which said slider has its forward edge retracted form said channel allowing said one flange to move into and out of said channel, said slider being spring biased into said lock position from said unlock position, said slider being movable outwardly past said unlock position further into a release position where it is free from said spring bias so as to be retained thereat.

5. An I/O relay interface module as set forth in claim 4, wherein said slider has a pair of resilient legs extending for engagement with a cam projection formed on said bottom of the housing, said cam projection having cam surfaces and dents each defined at one end of each of said cam surfaces, each of said resilient arm having its free end in pressed contact with said cam surface so long as said slider is between said unlock and lock positions such that said resilient arm is resiliently deformed to give said spring bias to said slider urging it to said lock position, said resilient arm having its free end engaged into said dent when the slider comes into said unlock position in which said resilient arm receives no substantial deformation so as not to give said spring bias to said slider.

6. An interface module for mounting a plurality of I/O devices which are adapted to be connected between individual I/O devices, said interface module comprising:
- a housing
- a plurality of sockets provide din said housing for detachably receiving respective ones of said devices;
- a terminal section on said housing, said terminal section including wire terminals internally connected to said devices through said sockets and adapted for wiring connection of said devices to corresponding other I/O devices;
- an I/O connector provide don said housing for connection of said devices such that the individual I/O devices can receive or transmit between associated I/O devices or indicate the operations of the individual I/O devices; wherein said housing has a channel extending along one dimension thereof for detachable connection to a mount rail having outwardly extending opposed flanges, said housing including a slider slidable in a direction transverse to said channel between a lock position in which said slider has its forward edge extending inwardly into said channel for engagement with one of said flanges and an unlock position in which said slider has its forward edge retracted from said channel allowing said one flange to move into and out of said channel, said slider being spring biased into said lock position from said unlock position, said slider being movable outwardly past said unlock position further into a release position where it is free form said spring bias so as to be retained thereat.

* * * * *